US012711404B1

(12) United States Patent
Tharad et al.

(10) Patent No.: US 12,711,404 B1
(45) Date of Patent: Aug. 18, 2026

(54) PREDICTION OF LOGIC OPTIMIZATION ALGORITHMS USING MACHINE LEARNING

(71) Applicant: XILINX, INC., San Jose, CA (US)

(72) Inventors: Akhil Tharad, Hyderabad (IN); Aman Gayasen, Hyderabad (IN); Padmini Gopalakrishnan, Hyderabad (IN); Jagadeesh Vasudevamurthy, San Jose, CA (US)

(73) Assignee: XILINX, INC., San Jose, CA (US)

( * ) Notice: Subject to any disclaimer, the term of this patent is extended or adjusted under 35 U.S.C. 154(b) by 1218 days.

(21) Appl. No.: 17/211,618

(22) Filed: Mar. 24, 2021

(51) Int. Cl.
*G06N 5/04* (2023.01)
*G06F 30/337* (2020.01)
*G06N 20/00* (2019.01)

(52) U.S. Cl.
CPC ............. *G06N 5/04* (2013.01); *G06F 30/337* (2020.01); *G06N 20/00* (2019.01)

(58) Field of Classification Search
CPC ......... G06N 5/04; G06N 20/00; G06F 30/337
See application file for complete search history.

(56) References Cited

U.S. PATENT DOCUMENTS 9,646,126 B1* 5/2017 Lu ........................ G06F 30/3312
2003/0177460 A1* 9/2003 Chen ........................ G06F 30/33 716/136
2013/0282445 A1* 10/2013 Chussil ................ G06Q 10/063 705/7.37
2020/0018994 A1* 1/2020 Nieuwenhuis .......... G06F 30/00
2021/0117601 A1* 4/2021 Srinivasan ............ G06F 30/327
2021/0287120 A1* 9/2021 Mamidi ................... G06N 5/01

OTHER PUBLICATIONS

Aysa Fakheri Tabrizi, "Eh?Predictor: A Deep Learning Framework to Identify Detailed Routing Short Violations From a Placed Netlist", May 16, 2019, IEEE, vol. 39 (Year: 2019).*
Rodolfo P. Santos, "An Optimization Mechanism Intended for Static Power Reduction Using Dual-VthTechnique", Jul. 2011 (Year: 2011).*
Jia Wu, "Hyperparameter Optimization for Machine Learning Models Based on Bayesian Optimization", Mar. 2019, pp. 26-40 (Year: 2019).*
Grewel, G. et al., "Automatic flow selection and quality-of-result estimation for fpga placement," 2017 IEEE Intl. Parallel and Distributed Processing Symposium Workshops (2017) pp. 115-123. (Year: 2017).*

(Continued)

*Primary Examiner* — Brian M Smith
(74) *Attorney, Agent, or Firm* — Patterson + Sheridan, LLP

(57) ABSTRACT

Embodiments herein describe optimizing a netlist using machine learning (ML) models that predict which of a plurality of optimization strategies (e.g., a plurality of optimization algorithms) will provide the best results. The netlist can then be optimized using the optimization strategy. Doing so provides significant time and compute resources savings since the netlist can be optimized only once using the selected optimization strategy rather than having to be optimized using each of the plurality of optimization strategies. Moreover, the embodiments herein can permit the addition of more optimization strategies, which could not be considered earlier because of runtime constraints.

17 Claims, 4 Drawing Sheets

(56) References Cited

OTHER PUBLICATIONS

Brownlee, G., "Softmax activation function with python," downloaded from <machinelearningmastery.com/softmax-activation-function-with-python> (Jun. 24, 2020) 13 pp. (Year: 2020).*
Agnesina, A. et al., "VLSI placement parameter optimization using deep reinforcement learning," ICCAD'20 (2020) 9 pp. (Year: 2020).*
Al-Hyari, A. et al., "An effective fpga placement flow selection framework using machine learning," 2018 30th Intl. Conf. on Microelectronics (2018) pp. 164-167. (Year: 2018).*

* cited by examiner

PROCESSOR 105

MEMORY 110

NETLIST 115

PARTITIONS 120

TRAINING MODULE 125

TRAINING NETLISTS 130

LABEL GENERATOR 135

FEATURE EXTRACTOR 140

INFERENCE MODULE 145

FEATURE EXTRACTOR 150

SCORES 155

OPTIMIZER 160

STORAGE 165

ML MODELS 170

PREDICTION OF LOGIC OPTIMIZATION ALGORITHMS USING MACHINE LEARNING

TECHNICAL FIELD

Examples of the present disclosure generally relate to using machine learning models corresponding to different optimization algorithms to predict which algorithm is best suited for a particular netlist.

BACKGROUND

Current netlist optimization relies on a brute force method where a netlist is optimized using multiple different netlist optimization algorithms. The resulting optimized netlists are then compared and evaluated to determine which provides the best results (e.g., smaller area size or fewer logic levels). The optimized netlist with the best results is then implemented in hardware while the other optimized netlists are discarded. Thus, current netlist optimization is wasteful since only one of the optimized netlists is selected while the others are unused. This problem becomes more pronounced as the number of optimization strategies being evaluated increases, as well as the size of the netlist.

SUMMARY

One embodiment describes a method that includes extracting a feature from a netlist, providing the extracted feature as an input to a plurality of machine learning (ML) models where each of the plurality of ML models corresponds to a respective one of a plurality of optimization strategies, predicting, using the plurality of ML models, which of the plurality of optimization strategies will be the best at optimizing the netlist, and optimizing the netlist using the optimization strategy predicted to be the best at optimizing the netlist.

Another embodiment described herein is a non-transitory computer readable storage medium storing instructions, which when executed on one or more processing devices, perform an operation. The operation includes extracting a feature from a netlist, providing the extracted feature as an input to a plurality of machine learning (ML) models where each of the plurality of ML models corresponds to a respective one of a plurality of optimization strategies, predicting, using the plurality of ML models, which of the plurality of optimization strategies will be the best at optimizing the netlist, and optimizing the netlist using the optimization strategy predicted to be the best at optimizing the netlist.

Another embodiment described herein is a method that includes extracting a feature from a netlist, providing the extracted feature as an input to a plurality of machine learning (ML) models where each of the plurality of ML models corresponds to a respective one of a plurality of optimization strategies, receiving scores from the plurality of ML models as a result of processing the extracted feature, selecting one of the plurality of optimization strategies based on comparing the scores, and optimizing the netlist using the selected optimization strategy.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
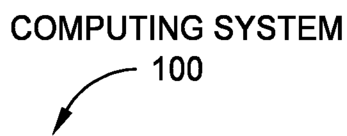
FIG. 1 is a block diagram of a computing system for using machine learning models to select an optimization strategy for a netlist, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe optimizing a netlist using machine learning (ML) models that predict which of a plurality of optimization strategies (e.g., a plurality of optimization algorithms) will provide the best results. The netlist can then be optimized using the optimization strategy. Doing so provides significant time and compute resources savings since the netlist can be optimized only once using the selected optimization strategy rather than having to be optimized using each of the plurality of optimization strategies.

In one embodiment, during a training phase, a ML model is generated for each of the plurality of optimization strategies. These ML models can be trained by extracting features from training netlists (such as the number of inputs/outputs in the netlist, number of gates, types of gates, etc.) and by indicating which optimization strategy provides the best results. Once trained, during an inference stage, features can be extracted from a received netlist (or a partition of a netlist) and sent to the ML models. Each ML model outputs a score for the netlist (e.g., prediction probabilities) which predicts how well the corresponding optimization strategy will be at optimizing the netlist. The optimization strategy with the best score can then be used to optimize the netlist.

FIG. 1 is a block diagram of a computing system 100 for using ML models 170 to select an optimization strategy for a netlist 115, according to an example. The computing system 100 includes a processor 105 which represents any number of processing elements with any number of processing cores. The system 100 also includes memory 110 and storage 165 which can include any combination of volatile and non-volatile memory elements. For example, the memory 110 can be RAM, cache, a hard drive (or combinations thereof) while the storage 165 may be a database that can be stored in a separate location (e.g., the cloud). The computing system 100 can be a computing device (e.g., a server or desktop computer) or can be multiple computing systems (e.g., multiple servers or computing resources in a datacenter).

The memory 110 includes a netlist 115, a training module 125 (e.g., a software application), an inference module 145 (e.g., a software application), and an optimizer 160 (e.g., a software application). In one embodiment, the netlist 115 defines a schematic to be implemented in hardware (e.g., circuitry) in a programmable device (e.g., a field programmable gate array (FPGA) or system-on-a-chip (SoC) containing programmable logic or a programmable network-on-a-chip (NoC)) or a non-programmable device such for fabricating an application specific integrated circuit (ASIC). The netlist 115 defines functional blocks of circuitry (e.g., physical electronic components) and how that circuitry should be communicatively coupled. The netlist may be generated by synthesizing a hardware description language (HDL) such as Verilog or VHDL using a synthesizing application (e.g., a software application), However, the embodiments herein are not limited to any particular technique for generating the netlist 115, or for how the netlist 115 is used once it is optimized.

In FIG. 1, the netlist 115 is divided into multiple partitions 120 using one or more criteria. For example, each partition 120 may include a maximum number for logic gates, or the netlist 115 may be divided into partitions 120 depending on the type of signals in the partitions. In one embodiment, the partitions 120 are optimized independently of each other. That is, using the techniques described herein, an optimization strategy can be selected specifically for each partition 120 and then used to optimize that partition. Thus, multiple netlist partitions 120 that are part of the same hardware design may be optimized using different optimization strategies. However, the embodiments herein are not limited to dividing a netlist 115 for a hardware design into multiple netlist partitions 120, but can be used to select an optimization strategy for the entire netlist 115 of the hardware design as a whole.

The training module 125 includes training netlists 130, a label generator 135 (e.g., a software application or software module) and a feature extractor 140 (e.g., a software application or software module). The training netlists 130 serve as training data to train the ML models 170, In one embodiment, the label generator 135 determines which optimization strategy is the best for each of the training netlists 130. The label generator 135 can optimize each training netlists 130 using each of the optimization strategies to determine which strategy produced the best results. The label generator 135 then provides a label indicating which optimization strategy is the best for each of the training netlists 130. The embodiments herein are not limited to any particular type of netlist optimization strategy or algorithm, but non-limiting examples include binary decision diagram (BDD) based algorithms, eliminate and fast-extract based algorithms, XOR based algorithms, and algorithms to reduce depth.

The feature extractor 140 extracts features for the training netlists 130 which are then used, along with the labels provided by the label generator 135, to train the ML models 170. These features can include different types of statistics and metadata about the training netlists 130. For example, features can include the number of input signals (or nets), number of logic gates, and number of output signals (or nets) in the netlist 130. Features could also include the type of the logic gates in the netlist 130 (e.g., whether the logic gates are multiplexers, XORs, ANDs, inverters, look-up-tables, etc.). The features could also include the logic level in the netlist 130. The logic level is the number of logic gates between two points (e.g., two registers) in the netlist 130. For example, if the signal path connecting two points has three sequential multiplexers then it has a logic level of three. If there are multiple signal paths connecting the two points, the logic level may be the signal path that has the most number of logic gates. Further, the features may include the fan-out of the netlist 130. A fan-out histogram can be determined that indicates the load distribution for all nets in the netlist 130. If the fan-out histogram indicates the netlist 130 has a large fan-out, then the netlist 130 is spread out. If the netlist has a small fan-out, then it is more like a cascade structure.

Further, the features may include tracking how many inputs in the netlists affect or influence an output pin of the netlist. In general, the feature extractor 140 can identify any feature in the training netlists 130 that may be useful for determining which optimization strategy is the best for optimizing the netlist 130. In sum, these features can include number of inputs, outputs, logic gates, types of logic gates, fan-out, logic level, input/output dependency, and the like.

As discussed in more detail in FIG. 3 below, the label and features (e.g., training data) provided by the label generator 135 and feature extractor 140 can be used to train the ML models 170. In one embodiment, the training module 125 trains a ML model 170 for ever optimization strategy the system 100 wants to consider. That is, each of the optimization strategies or algorithms may have a different corresponding ML model 170. Once trained, the ML models 170 are stored in the storage 165 and can be accessed by the inference module 145 during an inference stage.

The inference module 145 includes a feature extractor 150 for extracting the features in the netlist 115 (or a particular partition 120 in the netlist 115). These features may be the same features identified by the feature extractor 140 in the training module 125, or they may be a different set of features. For example, the feature extractor 140 may identify more or less features than the feature extractor 150. Or the feature extractors 140 and 150 may identify the same features in the netlists.

Once identified, the inference module 145 uses the features as inputs to the trained ML models 170. The ML models 170 then output scores 155 indicating a likelihood that the corresponding optimization strategy is the best strategy for optimizing the netlist 115 (or partition 120). That is, because each optimization strategy has a corresponding ML model 170, the score 155 generated by that ML model 170 indicates the likelihood the optimization strategy is the best for the netlist 115 or partition 120, For example, the scores 155 can be a prediction which can be represented by a numerical value, e.g., from 1-10 or a percentage.

The ML models 170 are not limited to any particular type of ML or artificial intelligence (AI) model. In one embodiment, the ML models 170 are binary classification models. Some non-limiting examples of the ML models 170 include random forest models with decision trees that output the scores 155, gradient boosting models, or models based on the k-nearest neighbor (KNN) algorithm.

The optimizer 160 optimizes the netlist 115 (or the netlist partition 120) using the optimization strategy selected using the scores 155. Advantageously, unlike prior netlist optimization workflows, the netlist 115 is only optimized once using the optimization strategy that is predicted to by the ML models 170 to result in the best results. Stated differently, the optimizer 160 does not have to optimize the netlist 115 using a plurality of optimization strategies and then determine which strategy resulted in the best optimized netlist.

Figure 2:
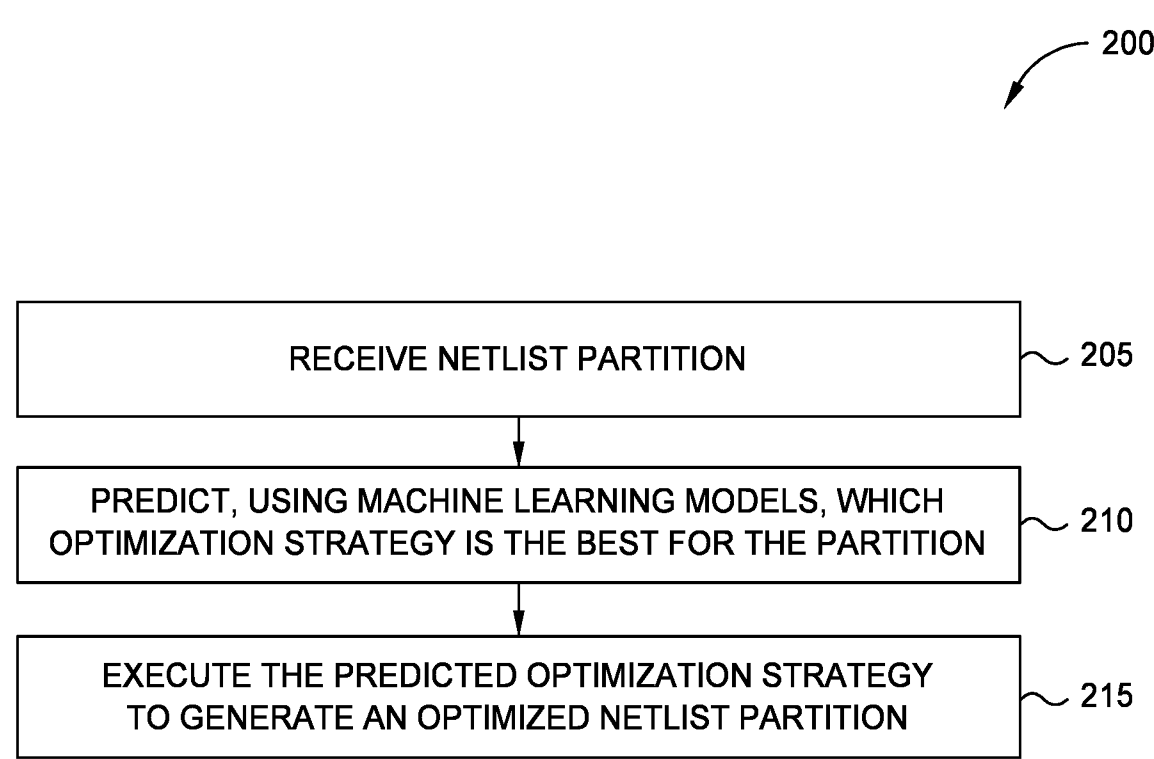
FIG. 2 is a flowchart for selecting an optimization strategy for a netlist using machine learning models, according to an example.

FIG. 2 is a flowchart of a method 200 for selecting an optimization strategy for a netlist using machine learning models, according to an example. At block 205, the computing system receives a netlist partition. The netlist partition may have been generated using the computing system, or generated by a different computing system and then transmitted to the computing system that optimizes the netlist partition. Further, while the embodiments below discuss optimizing a partition of a netlist for a hardware design, these embodiments can be applied to a hardware design where its netlist was not divided into partitions. However, the advantage of dividing a netlist into partitions is that different optimization strategies can be selected for each partition since each partition may have different features.

At block 210, the inference module predicts, using the ML Models, which optimization strategy is the best for the partition. That is, the method 200 assumes that a training stage has occurred previously where a ML model was trained for each of the optimization strategies to be considered. For example, a designer may have identified a list of optimization strategies that can be selected to optimize received netlist partitions.

The optimizations strategies can be any of the strategies listed above, as well as a combination of multiple optimization strategies. A training stage (which is discussed in detail in FIG. 3) is used to train a ML model for each optimization strategy (or each combination of optimization strategies). Thus, at block 210, the inference module can using the trained ML models during the inference stage to predict which optimization strategy is the best for optimizing the netlist partition.

In one embodiment, each ML model outputs a score (e.g., a prediction) indicating how successful it believes the corresponding optimization strategy will be at optimizing the received netlist partition. The inference module can, e.g., select the optimization strategy that corresponds to the ML model that output the best (e.g., highest) score to optimize the partition.

At block 215, the optimizer executes the predicted optimization strategy to generate an optimized netlist partition. Thus, the netlist partition is optimized only once using the optimization strategy that the ML models predicted would provide the best results.

However, in another embodiment, the optimizer may optimize the netlist partition using multiple optimization strategies. For example, the optimizer may optimize the partition using the top two or three optimization strategies that have the highest scores, rather than only the optimization strategy with the highest score generated by the ML models. The optimizer can then evaluate the results of optimizing the partition using the top optimization strategies and determine which provided the best results. The optimized netlist partition with the best results can then be used while the other optimized versions of the partition are discarded. In this manner, the ML models are used to narrow down the potential optimization strategies. For example, the inference module may use ML models for twenty different optimization strategies but then select the optimization strategies corresponding to the highest two or three scores to optimize the netlist partition. Thus, the system still saves considerable time relative to an optimization system where the partition is optimized using all twenty potential optimization strategies.

Figure 3:
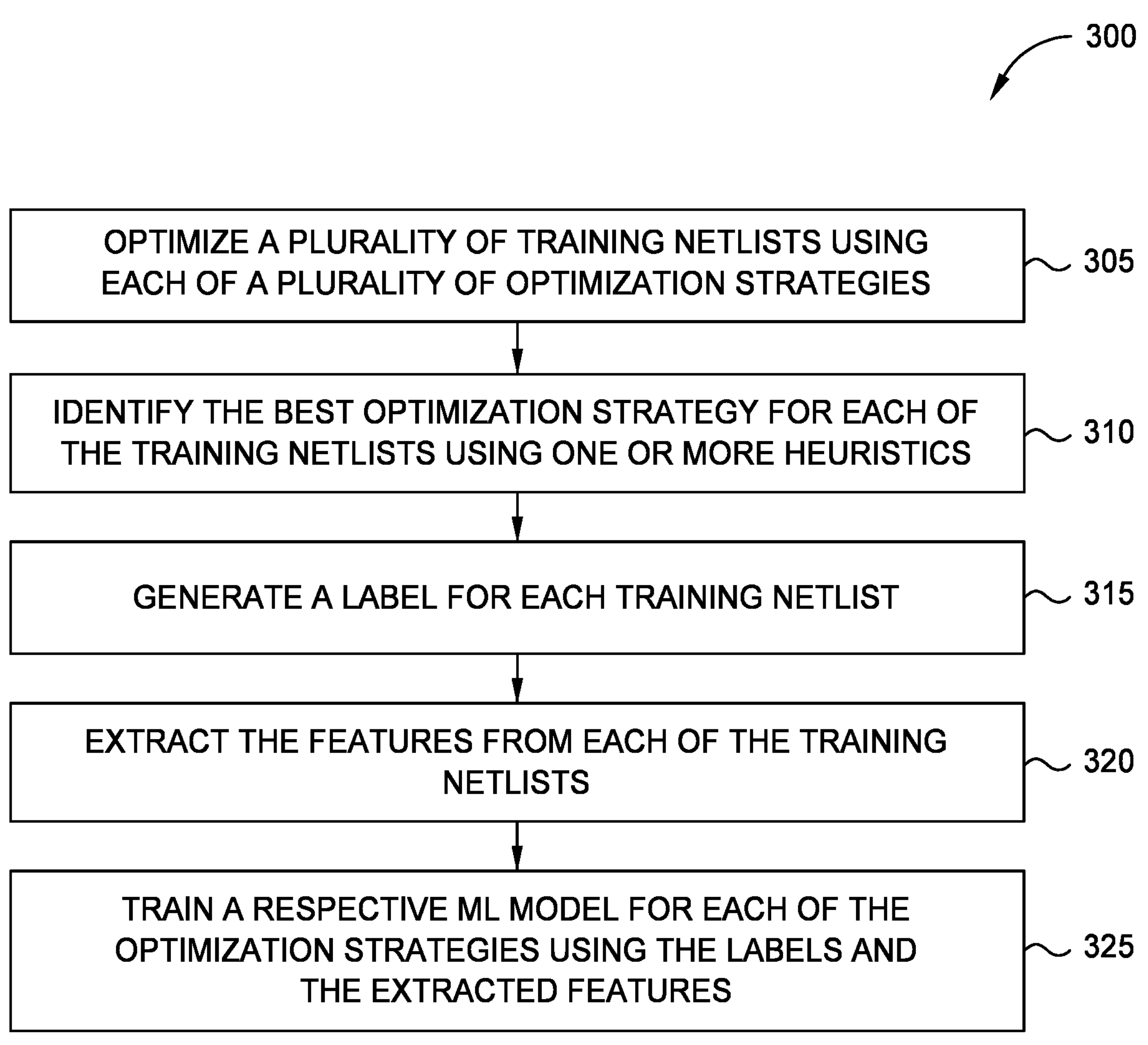
FIG. 3 is a flowchart for training machine learning models for a plurality of optimization strategies, according to an example.

FIG. 3 is a flowchart of a method 300 for training ML models for a plurality of optimization strategies, according to an example. At block 305, the optimizer optimizes a plurality of training netlists using each of a plurality of optimization strategies to generate a plurality of optimized versions for each of the plurality of training netlists. That is, the designer may have identified a list of optimization strategies to be considered for optimizing netlists. The optimizer can then optimize each of the training netlists (or training partitions) using each of the optimization strategies in the list.

At block 310, the optimizer identifies the best optimization strategy for each of the training netlists using one or more heuristics, One example heuristic is the size of the optimized training netlists. For example, the optimizer may evaluate the optimized versions of the netlist to determine which optimization strategy resulted in an optimized training netlist that can be implemented on the smallest area of circuitry (e.g., use less hardware resources, such as programmable logic). Another example heuristic is the logic level in the optimized netlist (e.g., how many logic gates are between two registers in the netlist). The optimization strategy that results in the greatest reduction in the logic level may be selected as the best strategy for that training netlist. However, the embodiments herein can be used with any suitable heuristic that can be leveraged to evaluate and determine which optimization strategy resulted in the best optimized netlist.

At block 315, the label generator generates a label for each trained netlist. In general, this label indicates which optimization strategy resulted in the best optimized version of the trained netlist when performing block 310. For example, the label may include setting a "one" corresponding to the optimization strategy that was the best, while setting a "zero" for all the other optimization strategies. However, in another example, the optimization strategies may be ranked or assigned relative scores in the label. In any case, the label informs the ML models during the training phase while optimization strategy generated the best results for the training netlist and which did not.

At block 320, the feature extractor extracts the features from each of the training netlists. These features can be any set of the features discussed above. Generally, the features can include information, statistics, or metadata derived from the training netlists.

At block 325, the inference module trains a respective ML model for each of the optimization strategies using the labels and the extracted features. Put differently, the labels and extracted features derived from the training netlists are inputs in the ML models. With the labels, the ML models know the optimization strategy that generated the best results when optimizing the netlists. The ML models then learn the features that indicate when the corresponding optimization strategy is good at optimizing the netlist and when it is not good at optimizing the netlist. Thus, later during the inference stage, an ML model can predict using the features of a received netlist whether its corresponding optimization strategy would be good, or not good, at optimizing the netlist. In this manner, the inference module can train a ML model for each of the optimization strategies.

Figure 4:
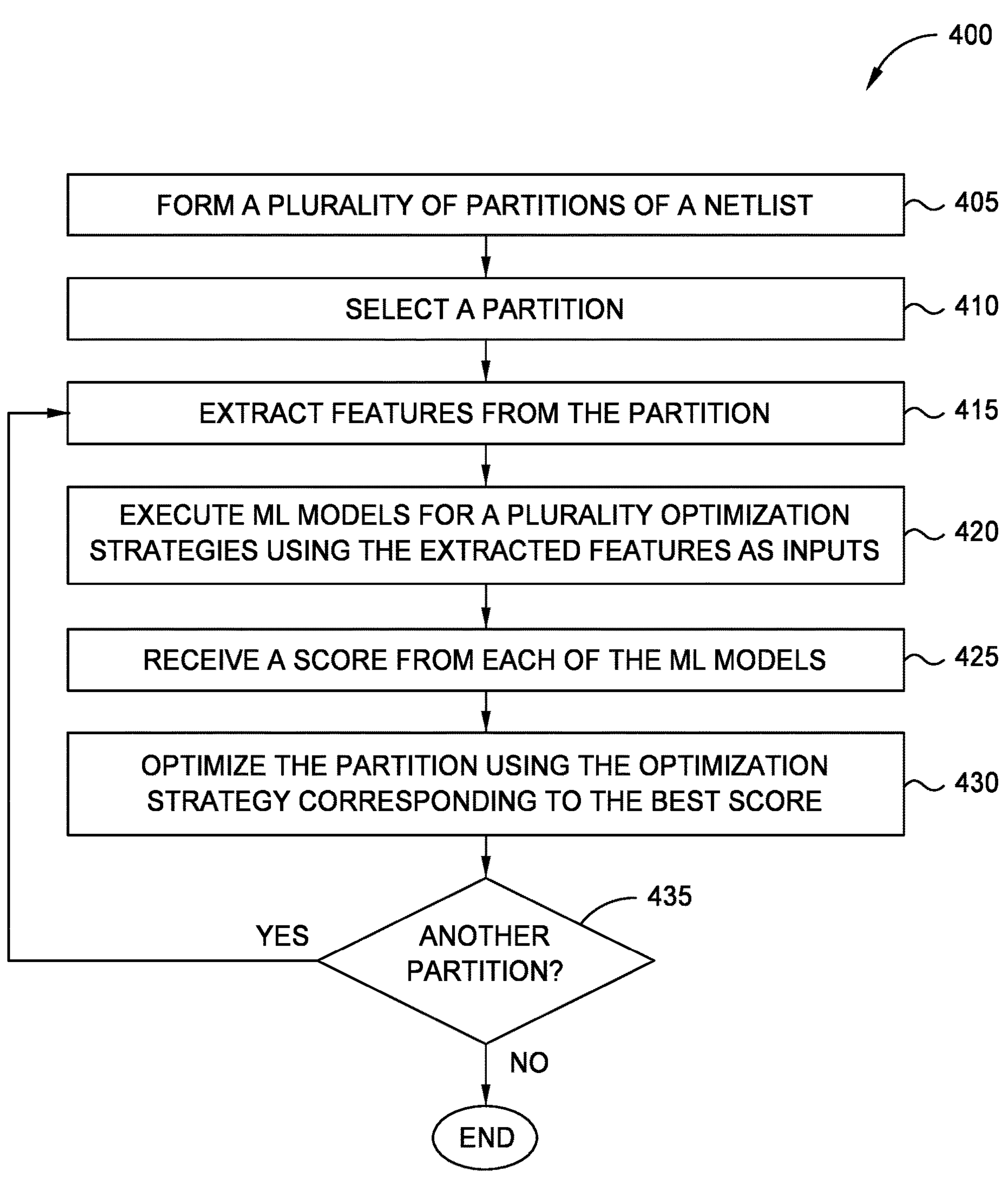
FIG. 4 is a flowchart for selecting an optimization strategy for a netlist using trained machine learning models, according to an example.

FIG. 4 is a flowchart of a method for selecting an optimization strategy for a netlist using trained ML models, according to an example. Method 400 assumes that the computing system has a plurality of trained ML models, where each ML model is trained to predict whether a corresponding optimization strategy would be good at optimizing a netlist (or a netlist partition), However, the embodiments herein are not limited to the training process described in the method 300 and can be used with other types of training processes, or even using ML models that have not been trained assuming those ML models can still provide sufficiently accurate scores.

At block 405, the computing system forms a plurality of partitions of a netlist. While not necessary, the computing system may use criteria such as the number of logic gates or the type of signals in the netlist to divide the netlist for a hardware design into the plurality of partitions. For example, each partition may have a maximum number of logic gates, or the partitions may include certain types of local signals.

At block 410, the computing system selects a partition to optimize. In one embodiment, the partitions can be independently optimized, which means the partitions can be optimized in any order.

At block 415, the feature extractor in the inference module extracts the features from the partition. These features can be any set of the features discussed above. Generally, the features can include information, statistics, or metadata derived from the netlist partitions.

At block 420, the inference module executes the ML models for the plurality of optimization strategies using the extracted features as inputs. Thus, like in the training stage, the extracted features are input into the ML models.

At block 425, the inference module receives a score (e.g., a prediction) from each of the ML modules indicating the likelihood that the corresponding optimization will result in the best optimized netlist for the partition. For example, the ML models evaluate the features to see how well they match features of training netlists which were best optimized using the corresponding optimization strategy. In one embodiment, the higher the score, the greater likelihood the ML model believes its corresponding optimization strategy would provide the best results.

At block 430, the optimizer optimizes the partition using the optimization strategy corresponding to the best score. In this manner, the optimizer only has to optimize the netlist once. However, in other embodiments, the optimizer may optimize the netlist using the optimization strategies corresponding to the highest two or three scores, evaluate which optimized version of the netlist produces the best results (e.g., using the heuristics discussed at block 310 of the method 300), and select the optimized version of the partition with the best results while discarding the other versions.

At block 435, the inference module determines whether there are additional partitions of the netlist to be considered, and if so, the method 400 returns to block 415 where the method 400 is repeated for that partition. If not, the method 400 ends. The optimized partitions for the netlist can then be used to implement the hardware design on a hardware device (e.g., a design for an ASIC, an FPGA, or a SoC with programmable logic or a programmable NoC).

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method, comprising:

partitioning a netlist into a plurality of partitions based on parameters of hardware represented in the plurality of partitions, wherein the netlist defines a schematic for fabricating an application-specific integrated circuit (ASIC);

for each of the plurality of partitions:

extracting a feature from the partition that defines the schematic for the ASIC including: information, statistics, or metadata derived from the partition;

providing the extracted feature as an input to a plurality of machine learning (ML) models, wherein each of the plurality of ML models corresponds to a respective one of a plurality of optimization algorithms, and wherein each of the plurality of ML models is one of: binary classification models, random forest models, gradient boosting models, or models based on a k-nearest neighbor (KNN) algorithm;

generating, at each ML model, a score indicating a likelihood that the respective optimization algorithm is better at optimizing the partition relative to the other plurality of optimization algorithms represented by the other ML models; and implementing a selected optimization algorithm on optimizing the partition based on the scores output by the plurality of ML models, wherein at least one of the plurality of optimization algorithms is not used to optimize the partition; and fabricating the ASIC using the optimized plurality of partitions of the netlist.

2. The method of claim 1, wherein the selected optimization algorithm has a best score among the scores generated by the plurality of ML models.

3. The method of claim 1, wherein the partition is optimized using only the optimization algorithm with the likelihood to be the best at optimizing the partition.

4. The method of claim 1, wherein the partition is optimized using multiple optimization algorithms forming a subset of the plurality of optimization algorithms in order to generate a plurality of optimized versions of the partition, the method further comprising:

evaluating the plurality of optimized versions of the partition using one or more heuristics in order to select which of the plurality of optimized versions of the partition to use while the remaining optimized versions of the partition are discarded.

5. The method of claim 1, further comprising, before extracting the feature of the partition:

training the plurality of ML models using (i) extracted features of a plurality of training netlists and (ii) labels, wherein the labels indicate which of the plurality of optimization algorithms is the best for optimizing the plurality of training netlists.

6. The method of claim 5, further comprising:

generating the labels by:

optimizing each of the plurality of training netlists using each of the plurality of optimization algorithms to generate a plurality of optimized versions of each of the plurality of training netlists; and evaluating the plurality of optimization algorithms for each of the plurality of training netlists to determine which of the plurality of optimization algorithms provided the best optimized version, wherein the labels indicate which of the plurality of optimization algorithms provided the best optimized version and which of the plurality of optimization algorithms did not.

7. A non-transitory computer readable storage medium storing instructions, which when executed on one or more processing devices, perform an operation, the operation comprising:

partitioning a netlist into a plurality of partitions based on parameters of hardware represented in the plurality of partitions, wherein the netlist defines a schematic for fabricating an application-specific integrated circuit (ASIC);

for each of the plurality of partitions:

extracting a feature from the partition that defines the schematic for the ASIC including: information, statistics, or metadata derived from the partition;

providing the extracted feature as an input to a plurality of machine learning (ML) models, wherein each of the plurality of ML models corresponds to a respective one of a plurality of optimization algorithms, and wherein each of the plurality of ML models is one of: binary classification models, random forest models, gradient boosting models, or models based on a k-nearest neighbor (KNN) algorithm;

generating, at each ML model, a score indicating a likelihood that the respective optimization algorithm is better at optimizing the partition relative to the other plurality of optimization algorithms represented by the other ML models; and implementing a selected optimization algorithm on optimizing the partition based on the scores output by the plurality of ML models, wherein at least one of the plurality of optimization algorithms is not used to optimize the partition; and fabricating the ASIC using the optimized plurality of partitions of the netlist.

8. The non-transitory computer readable storage medium of claim 7, wherein the selected optimization algorithm has a best score among the scores output by the plurality of ML models.

9. The non-transitory computer readable storage medium of claim 7, wherein the partition is optimized using only the optimization algorithm with the likelihood to be the best at optimizing the partition.

10. The non-transitory computer readable storage medium of claim 7, wherein the partition is optimized using multiple optimization algorithms forming a subset of the plurality of optimization algorithms in order to generate a plurality of optimized versions of the partition, the non-transitory computer readable storage medium further comprising:

evaluating the plurality of optimized versions of the partition using one or more heuristics in order to select which of the plurality of optimized versions of the partition to use while the remaining optimized versions of the partition are discarded.

11. The non-transitory computer readable storage medium of claim 7, further comprising, before extracting the feature of the partition:

training the plurality of ML models using (i) extracted features of a plurality of training netlists and (ii) labels, wherein the labels indicate which of the plurality of optimization algorithms is the best for optimizing the plurality of training netlists.

12. The non-transitory computer readable storage medium of claim 11, further comprising:

generating the labels by:

optimizing each of the plurality of training netlists using each of the plurality of optimization algorithms to generate a plurality of optimized versions of each of the plurality of training netlists; and evaluating the plurality of optimization algorithms for each of the plurality of training netlists to determine which of the plurality of optimization algorithms provided the best optimized version, wherein the labels indicate which of the plurality of optimization algorithms provided the best optimized version and which of the plurality of optimization algorithms did not.

13. A method, comprising:

partitioning a netlist into a plurality of partitions based on parameters of hardware represented in the plurality of partitions, wherein the netlist defines a schematic for fabricating an application-specific integrated circuit (ASIC);

for each of the plurality of partitions:

extracting a feature from the partition that defines the schematic for the ASIC including: information, statistics, or metadata derived from the partition;

providing the extracted feature as an input to a plurality of machine learning (ML) models, wherein each of the plurality of ML models corresponds to a respective one of a plurality of optimization algorithms, and wherein each of the plurality of ML models is one of: binary classification models, random forest models, gradient boosting models, or models based on a k-nearest neighbor (KNN) algorithm;

receiving scores from the plurality of ML models indicating a likelihood that the respective optimization algorithm is better at optimizing the partition relative to the other plurality of optimization algorithms represented by the other ML models as a result of processing the extracted feature;

selecting one of the plurality of optimization algorithms based on comparing the scores; and implementing the selected one of the plurality of optimization algorithms on optimizing the partition, wherein at least one of the plurality of optimization algorithms is not used to optimize the partition; and fabricating the ASIC using the optimized plurality of partitions of the netlist.

14. The method of claim 13, wherein the partition is implemented with only the optimization algorithm corresponding to a best score among the scores received from the plurality of ML models.

15. The method of claim 13, wherein the partition is optimized using multiple optimization algorithms forming a subset of the plurality of optimization algorithms in order to generate a plurality of optimized versions of the partition, the method further comprising:

evaluating the plurality of optimized versions of the partition using one or more heuristics in order to select which of the plurality of optimized versions of the partition to use while the remaining ones optimized versions of the partition are discarded.

16. The method of claim 13, further comprising, before extracting the feature of the partition:

training the plurality of ML models using (i) extracted features of a plurality of training netlists and (ii) labels, wherein the labels indicate which of the plurality of optimization algorithms is best for optimizing the plurality of training netlists.

17. The method of claim 16, further comprising:

generating the labels by:

optimizing each of the plurality of training netlists using each of the plurality of optimization algorithms to generate a plurality of optimized versions of each of the plurality of training netlists; and evaluating the plurality of optimization algorithms for each of the plurality of training netlists to determine which of the plurality of optimization algorithms provided the best optimized version, wherein the labels indicate which of the plurality of optimization algorithms provided the best optimized version and which of the plurality of optimization algorithms did not.

* * * * *